(12) United States Patent
Bibl et al.

(10) Patent No.: US 9,773,750 B2
(45) Date of Patent: Sep. 26, 2017

(54) METHOD OF TRANSFERRING AND BONDING AN ARRAY OF MICRO DEVICES

(71) Applicant: LuxVue Technology Corporation, Santa Clara, CA (US)

(72) Inventors: Andreas Bibl, Los Altos, CA (US); John A. Higginson, Santa Clara, CA (US); Hsin-Hua Hu, Los Altos, CA (US); Hung-Fai Stephen Law, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 919 days.

(21) Appl. No.: 13/749,647

(22) Filed: Jan. 24, 2013

(65) Prior Publication Data

US 2013/0210194 A1    Aug. 15, 2013

Related U.S. Application Data

(63) Continuation-in-part of application No. 13/436,260, filed on Mar. 30, 2012, which is a
(Continued)

(51) Int. Cl.
*B23K 5/22* (2006.01)
*B23K 31/02* (2006.01)
(Continued)

(52) U.S. Cl.
CPC ............ *H01L 24/83* (2013.01); *H01L 24/75* (2013.01); *H01L 24/95* (2013.01);
(Continued)

(58) Field of Classification Search
None
See application file for complete search history.

(56) References Cited

U.S. PATENT DOCUMENTS

| 3,717,743 A | 2/1973 | Costello |
| 3,935,986 A | 2/1976 | Lattari et al. |

(Continued)

FOREIGN PATENT DOCUMENTS

| JP | 05074873 A | * 3/1993 |
| JP | 07-060675 A | 3/1995 |

(Continued)

OTHER PUBLICATIONS

Sugimoto, English translation of JP 05-074873 A, Mar. 26, 1993.*
(Continued)

*Primary Examiner* — Erin Saad
*Assistant Examiner* — Carlos Gamino
(74) *Attorney, Agent, or Firm* — Blakely Sokoloff Taylor & Zafman LLP

(57) ABSTRACT

Electrostatic transfer head array assemblies and methods of transferring and bonding an array of micro devices to a receiving substrate are described. In an embodiment, a method includes picking up an array of micro devices from a carrier substrate with an electrostatic transfer head assembly supporting an array of electrostatic transfer heads, contacting a receiving substrate with the array of micro devices, transferring energy from the electrostatic transfer head assembly to bond the array of micro devices to the receiving substrate, and releasing the array of micro devices onto the receiving substrate.

2 Claims, 10 Drawing Sheets

Related U.S. Application Data continuation-in-part of application No. 13/372,422, filed on Feb. 13, 2012, now Pat. No. 8,349,116.

(60) Provisional application No. 61/749,892, filed on Jan. 7, 2013, provisional application No. 61/597,658, filed on Feb. 10, 2012, provisional application No. 61/597,109, filed on Feb. 9, 2012.

(51) Int. Cl.
*H01L 23/00* (2006.01)
*H01L 21/67* (2006.01)

(52) U.S. Cl.
CPC .............. *H01L 21/67144* (2013.01); *H01L 2224/29105* (2013.01); *H01L 2224/29109* (2013.01); *H01L 2224/29111* (2013.01); *H01L 2224/29113* (2013.01); *H01L 2224/29118* (2013.01); *H01L 2224/29124* (2013.01); *H01L 2224/29144* (2013.01); *H01L 2224/29147* (2013.01); *H01L 2224/29155* (2013.01); *H01L 2224/29183* (2013.01); *H01L 2224/7598* (2013.01); *H01L 2224/75261* (2013.01); *H01L 2224/75281* (2013.01); *H01L 2224/75282* (2013.01); *H01L 2224/75283* (2013.01); *H01L 2224/75725* (2013.01); *H01L 2224/83* (2013.01); *H01L 2224/8383* (2013.01); *H01L 2224/83193* (2013.01); *H01L 2224/83203* (2013.01); *H01L 2224/83805* (2013.01); *H01L 2224/83825* (2013.01); *H01L 2224/83948* (2013.01); *H01L 2924/01322* (2013.01); *H01L 2924/01327* (2013.01); *H01L 2924/12041* (2013.01); *H01L 2924/1461* (2013.01); *H01L 2933/0066* (2013.01)

(56) References Cited

U.S. PATENT DOCUMENTS

| | | | |
|---|---|---|---|
| 5,131,582 A | 7/1992 | Kaplan et al. | |
| 5,378,926 A | 1/1995 | Chi et al. | |
| 5,439,161 A * | 8/1995 | Kawatani et al. | 228/180.21 |
| 5,592,358 A | 1/1997 | Shamouilian et al. | |
| 5,611,481 A * | 3/1997 | Akamatsu et al. | 228/180.22 |
| 5,740,956 A | 4/1998 | Seo et al. | |
| 5,794,839 A | 8/1998 | Kimura et al. | |
| 5,839,187 A | 11/1998 | Sato et al. | |
| 5,851,664 A | 12/1998 | Bennett et al. | |
| 5,857,610 A * | 1/1999 | Hoshiba et al. | 228/246 |
| 5,878,942 A * | 3/1999 | Kodama et al. | 228/180.22 |
| 5,888,847 A | 3/1999 | Rostoker et al. | |
| 5,903,428 A | 5/1999 | Grimard et al. | |
| 5,996,218 A | 12/1999 | Shamouilian et al. | |
| 6,071,795 A | 6/2000 | Cheung et al. | |
| 6,080,650 A | 6/2000 | Edwards | |
| 6,142,356 A * | 11/2000 | Yamazaki et al. | 228/6.2 |
| 6,240,634 B1 * | 6/2001 | Kira et al. | 29/836 |
| 6,335,263 B1 | 1/2002 | Cheung et al. | |
| 6,403,985 B1 | 6/2002 | Fan et al. | |
| 6,420,242 B1 | 7/2002 | Cheung et al. | |
| 6,427,901 B2 * | 8/2002 | Dautartas | 228/180.22 |
| 6,521,511 B1 | 2/2003 | Inoue et al. | |
| 6,558,109 B2 | 5/2003 | Gibbel | |
| 6,613,610 B2 | 9/2003 | Iwafuchi et al. | |
| 6,621,157 B1 * | 9/2003 | Wirz et al. | 257/692 |
| 6,629,553 B2 | 10/2003 | Odashima et al. | |
| 6,670,038 B2 | 12/2003 | Sun et al. | |
| 6,683,368 B1 | 1/2004 | Mostafazadeh | |
| 6,769,469 B2 * | 8/2004 | Yamada | 156/556 |
| 6,786,390 B2 | 9/2004 | Yang et al. | |
| 6,878,607 B2 | 4/2005 | Inoue et al. | |
| 6,918,530 B2 | 7/2005 | Shinkai et al. | |
| 7,033,842 B2 | 4/2006 | Haji et al. | |
| 7,148,127 B2 | 12/2006 | Oohata et al. | |
| 7,165,711 B2 * | 1/2007 | Barretto et al. | 228/49.5 |
| 7,208,337 B2 | 4/2007 | Eisert et al. | |
| 7,353,596 B2 | 4/2008 | Shida et al. | |
| 7,358,158 B2 | 4/2008 | Aihara et al. | |
| 7,439,549 B2 | 10/2008 | Marchl et al. | |
| 7,508,065 B2 * | 3/2009 | Sherrer et al. | 257/704 |
| 7,585,703 B2 | 9/2009 | Matsumura et al. | |
| 7,628,309 B1 | 12/2009 | Eriksen et al. | |
| 7,669,210 B2 * | 2/2010 | Izumisawa | 720/675 |
| 7,714,336 B2 | 5/2010 | Imai | |
| 7,723,764 B2 | 5/2010 | Oohata et al. | |
| 7,795,629 B2 | 9/2010 | Watanabe et al. | |
| 7,797,820 B2 | 9/2010 | Shida et al. | |
| 7,838,410 B2 | 11/2010 | Hirao et al. | |
| 7,854,365 B2 | 12/2010 | Li et al. | |
| 7,880,184 B2 | 2/2011 | Iwafuchi et al. | |
| 7,880,315 B2 | 2/2011 | Beyne et al. | |
| 7,884,543 B2 | 2/2011 | Doi | |
| 7,888,690 B2 | 2/2011 | Iwafuchi et al. | |
| 7,906,787 B2 | 3/2011 | Kang | |
| 7,910,945 B2 | 3/2011 | Donofrio et al. | |
| 7,927,976 B2 | 4/2011 | Menard | |
| 7,928,465 B2 | 4/2011 | Lee et al. | |
| 7,972,875 B2 | 7/2011 | Rogers et al. | |
| 7,989,266 B2 | 8/2011 | Borthakur et al. | |
| 7,999,454 B2 | 8/2011 | Winters et al. | |
| 8,023,248 B2 | 9/2011 | Yonekura et al. | |
| 8,076,670 B2 | 12/2011 | Slater et al. | |
| 8,186,568 B2 | 5/2012 | Coronel et al. | |
| 8,317,077 B2 * | 11/2012 | Hwang et al. | 228/39 |
| 8,333,860 B1 | 12/2012 | Bibl et al. | |
| 8,349,116 B1 | 1/2013 | Bibl et al. | |
| 8,381,965 B2 * | 2/2013 | Jang et al. | 228/180.22 |
| 8,383,506 B1 * | 2/2013 | Golda et al. | 438/619 |
| 2001/0029088 A1 | 10/2001 | Odajima et al. | |
| 2002/0056740 A1 * | 5/2002 | Hayashi | 228/110.1 |
| 2002/0076848 A1 | 6/2002 | Spooner et al. | |
| 2003/0010975 A1 | 1/2003 | Gibb et al. | |
| 2003/0177633 A1 | 9/2003 | Haji et al. | |
| 2004/0100164 A1 | 5/2004 | Murata et al. | |
| 2004/0232439 A1 | 11/2004 | Gibb et al. | |
| 2004/0266048 A1 | 12/2004 | Platt et al. | |
| 2005/0224822 A1 | 10/2005 | Liu | |
| 2005/0232728 A1 | 10/2005 | Rice et al. | |
| 2006/0055035 A1 | 3/2006 | Lin et al. | |
| 2006/0065905 A1 | 3/2006 | Eisert et al. | |
| 2006/0157721 A1 | 7/2006 | Tran et al. | |
| 2006/0160276 A1 | 7/2006 | Brown et al. | |
| 2006/0214299 A1 | 9/2006 | Fairchild et al. | |
| 2007/0000592 A1 * | 1/2007 | Fares et al. | 156/64 |
| 2007/0048902 A1 | 3/2007 | Hiatt et al. | |
| 2007/0166851 A1 | 7/2007 | Tran et al. | |
| 2007/0194330 A1 | 8/2007 | Ibbetson et al. | |
| 2007/0284409 A1 * | 12/2007 | Kobrinsky et al. | 228/44.7 |
| 2008/0048206 A1 | 2/2008 | Lee et al. | |
| 2008/0163481 A1 | 7/2008 | Shida et al. | |
| 2008/0194054 A1 | 8/2008 | Lin et al. | |
| 2008/0196237 A1 | 8/2008 | Shinya et al. | |
| 2008/0205027 A1 | 8/2008 | Coronel et al. | |
| 2008/0283190 A1 | 11/2008 | Papworth et al. | |
| 2008/0283849 A1 | 11/2008 | Imai | |
| 2008/0303038 A1 | 12/2008 | Grotsch et al. | |
| 2009/0068774 A1 | 3/2009 | Slater et al. | |
| 2009/0072382 A1 | 3/2009 | Guzek | |
| 2009/0125141 A1 * | 5/2009 | Noda et al. | 700/121 |
| 2009/0127315 A1 * | 5/2009 | Okita | 228/102 |
| 2009/0146303 A1 | 6/2009 | Kwon | |
| 2009/0303713 A1 | 12/2009 | Chang et al. | |
| 2009/0314991 A1 | 12/2009 | Cho et al. | |
| 2010/0046134 A1 * | 2/2010 | Mizuno et al. | 361/234 |
| 2010/0052004 A1 | 3/2010 | Slater et al. | |
| 2010/0097738 A1 | 4/2010 | Kang et al. | |
| 2010/0105172 A1 | 4/2010 | Li et al. | |
| 2010/0123164 A1 | 5/2010 | Suehiro et al. | |
| 2010/0176415 A1 | 7/2010 | Lee et al. | |
| 2010/0188794 A1 | 7/2010 | Park et al. | |
| 2010/0200884 A1 | 8/2010 | Lee et al. | |
| 2010/0203659 A1 | 8/2010 | Akaike et al. | |

(56) References Cited

U.S. PATENT DOCUMENTS

| | | |
|---|---|---|
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0064642 A1 | 3/2012 | Huang et al. |
| 2012/0134065 A1* | 5/2012 | Furuya et al. ................ 361/234 |
| 2013/0019996 A1 | 1/2013 | Routledge |
| 2013/0038416 A1 | 2/2013 | Arai et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |

FOREIGN PATENT DOCUMENTS

| | | | |
|---|---|---|---|
| JP | 3406207 | | 5/1999 |
| JP | 11340288 A | * | 12/1999 |
| JP | 2001-298072 A | | 10/2001 |
| JP | 2001-353682 A | | 12/2001 |
| JP | 2002-134822 A | | 5/2002 |
| JP | 2002-164695 A | | 6/2002 |
| JP | 2002-176291 A | | 6/2002 |
| JP | 2002-240943 A | | 8/2002 |
| JP | 2004-095944 A | | 3/2004 |
| JP | 2004-096046 A | | 3/2004 |
| JP | 2008-200821 A | | 9/2008 |
| JP | 2010-056458 A | | 3/2010 |
| JP | 2010-161212 A | | 7/2010 |
| JP | 2010-186829 A | | 8/2010 |
| JP | 2011-181834 A | | 9/2011 |
| KR | 10-0610632 B1 | | 8/2006 |
| KR | 10-2007-0042214 A | | 4/2007 |
| KR | 10-2007-0093091 A | | 9/2007 |
| KR | 10-0973928 B1 | | 8/2010 |
| KR | 10-1001454 B1 | | 12/2010 |
| KR | 10-2007-0006885 A | | 1/2011 |
| KR | 10-2011-0084888 A | | 7/2011 |
| WO | WO 2005-099310 A2 | | 10/2005 |
| WO | WO 2011/123285 | | 10/2011 |

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low_Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Dragoi, et al., "Metal Wafer Bonding for MEMS Devices," Romanian Journal of Information Science and Technology, vol. 13, No. 1, 2010, pp. 65-72.

Roman, et al., "Low Stress Die Attach by Low Temperature Transient liquid Phase Bonding," The International Society for Hybrid Microelectronics (ISHM) Symposium Proceedings, Oct. 1992, pp. 1-6.

Studnitzky, et al., "Diffusion Soldering for Stable High-Temperature Thin-Film Bonds," JOM, Dec. 2002, pp. 58-63.

Welch, et al., "Gold-Indium Transient Liquid Phase (TLP) Wafer Bonding for MEMS Vacuum Packaging," MEMS 2008, Tucson, AZ, Jan. 13-17, 2008, pp. 806-809.

PCT International Search Report and Written Opinion for International Application No. PCT/US2013/024939, dated May 13, 2013, 12 pages.

* cited by examiner eutectic alloy bonding transient liquid phase bonding solid state diffusion bonding

METHOD OF TRANSFERRING AND BONDING AN ARRAY OF MICRO DEVICES

RELATED APPLICATIONS

This application claims the benefit of priority from U.S. Provisional Patent Application Ser. No. 61/749,892 filed on Jan. 7, 2013 and is a continuation-in-part of U.S. patent application Ser. No. 13/436,260 filed on Mar. 30, 2012, which is a continuation-in-part of U.S. patent application Ser. No. 13/372,422 filed on Feb. 13, 2012 now issued as U.S. Pat. No. 8,349,116, and claims the benefit of priority from U.S. Provisional Patent Application Ser. No. 61/597,658 filed on Feb. 10, 2012 and U.S. Provisional Patent Application Ser. No. 61/597,109 filed on Feb. 9, 2012, the full disclosures of which are incorporated herein by reference.

BACKGROUND

Field

The present invention relates to micro devices. More particularly embodiments of the present invention relate to methods for transferring and bonding an array of micro devices to a receiving substrate.

Background Information

Integration and packaging issues are one of the main obstacles for the commercialization of micro devices such as radio frequency (RF) microelectromechanical systems (MEMS) microswitches, light-emitting diode (LED) display and lighting systems, MEMS, or quartz-based oscillators.

Traditional technologies for transferring of devices include transfer by wafer bonding from a transfer wafer to a receiving wafer. Such implementations include "direct printing" and "transfer printing" involving wafer bonding/de-bonding steps in which a transfer wafer is de-bonded from a device after bonding the device to the receiving wafer. In addition, the entire transfer wafer with the array of devices is involved in the transfer process.

Other technologies for transferring of devices include transfer printing with elastomeric stamps. In one such implementation an array of elastomeric stamps with posts matching the pitch of devices on a source wafer are brought into intimate contact with the surface of the devices on the source wafer and bonded with van der Walls interaction. The array of devices can then be picked up from the source wafer, transferred to a receiving substrate, and released onto the receiving substrate.

SUMMARY OF THE INVENTION

Electrostatic transfer head array assemblies and methods of transferring and bonding an array of micro devices to a receiving substrate are described. In an embodiment, a method includes picking up an array of micro devices from a carrier substrate with an electrostatic transfer head assembly supporting an array of electrostatic transfer heads, contacting a receiving substrate with the array of micro devices, transferring energy from the electrostatic transfer head assembly to bond the array of micro devices to the receiving substrate, and releasing the array of micro devices onto the receiving substrate. In an embodiment, each micro device has a maximum width of 1-100 μm. Each electrostatic transfer head in the array of electrostatic transfer heads may also pick up a single micro device.

In an embodiment, contacting the receiving substrate with the array of micro devices includes contacting a micro device bonding layer with a receiving substrate bonding layer for each respective micro device. In accordance with embodiments of the invention, energy is transferred from the electrostatic transfer head assembly to bond the array of micro devices to the receiving substrate using a bonding technique such as thermal bonding or thermocompression bonding (TCB). For example, heat can be transferred from the electrostatic transfer head assembly, carrier substrate holder, or receiving substrate holder. Furthermore, the transferred energy may be utilized to bond the array of micro devices to the receiving substrate with a variety of bonding mechanisms in which one or more bonding layers may or may not be liquefied.

In one embodiment, the transfer of energy forms a eutectic alloy from the micro device bonding layer and the receiving substrate bonding layer. In one embodiment, the transfer of energy liquefies the receiving substrate bonding layer to form an inter-metallic compound layer having an ambient melting temperature higher than an ambient melting temperature of the receiving substrate bonding layer. In an embodiment, the transfer of energy causes solid state diffusion between the micro device bonding layer and the receiving substrate bonding layer. Annealing may also be performed after releasing the array of micro devices into the receiving substrate.

In some embodiments the receiving substrate bonding layer has a lower ambient liquidus temperature than the micro device bonding layer. In an embodiment the receiving substrate bonding material includes a material such as indium or tin, and the micro device bonding layer includes a material such as gold, silver, aluminum, bismuth, copper, zinc, and nickel. The micro device bonding layer may also be wider than the receiving substrate bonding layer.

In one embodiment, the substrate supporting the array of electrostatic transfer heads is maintained above room temperature from the time the array of micro devices are picked up from the carrier substrate until they are released onto the receiving substrate. For example, the substrate supporting the array of electrostatic transfer heads can be maintained above the ambient liquidus temperature of the receiving substrate bonding layer, such as indium or tin.

DETAILED DESCRIPTION OF THE INVENTION

Figure 1:
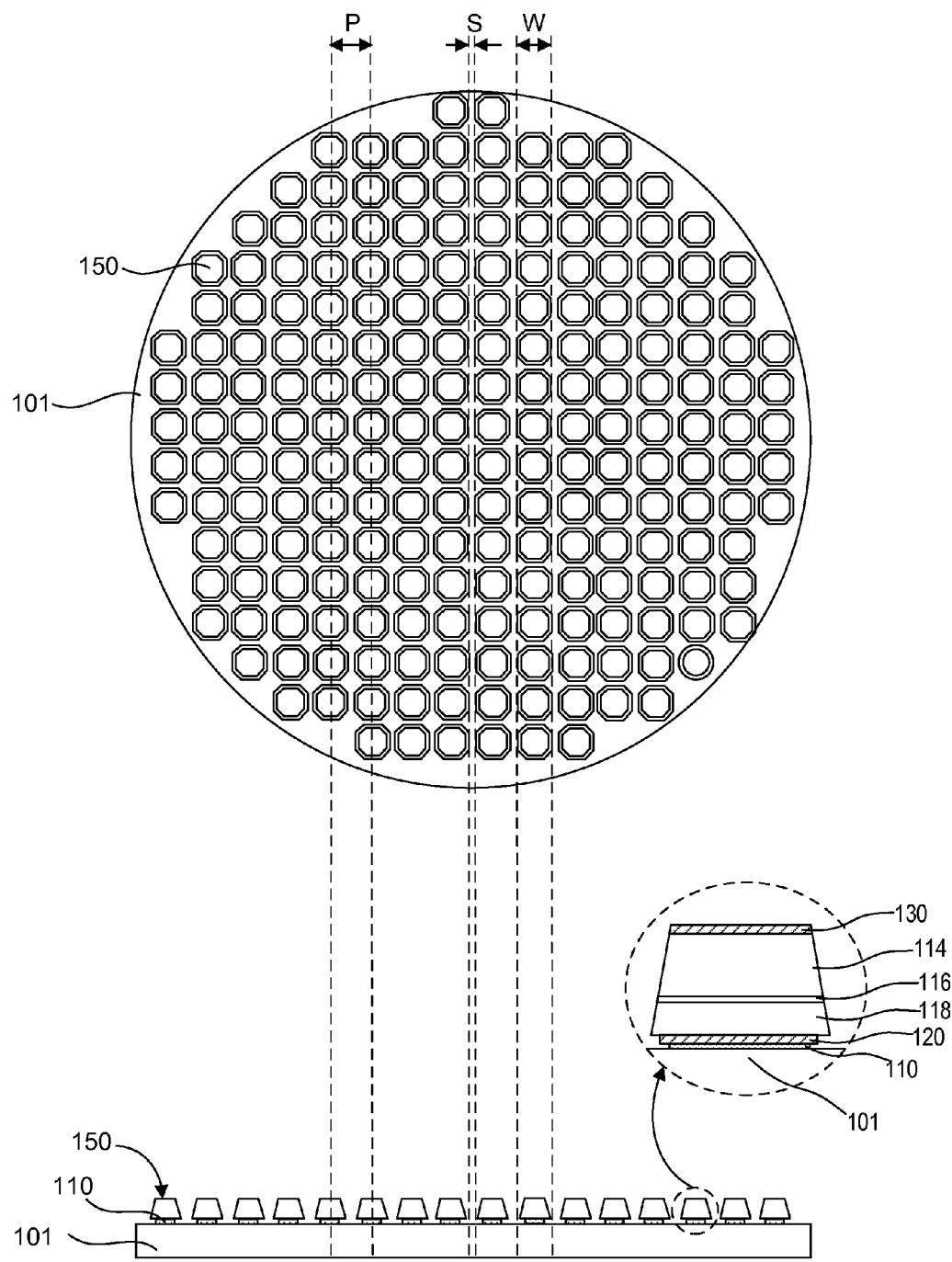
FIG. 1 includes top and cross-sectional side view illustrations of a carrier substrate and an array of micro LED devices in accordance with an embodiment of the invention.

Embodiments of the present invention describe electrostatic transfer head assemblies and methods of transferring and bonding an array of micro devices to a receiving substrate. For example, the receiving substrate may be, but is not limited to, a display substrate, a lighting substrate, a substrate with functional devices such as transistors or integrated circuits, or a substrate with metal distribution lines. While some embodiments of the present invention are described with specific regard to micro LED devices, it is to be appreciated that embodiments of the invention are not so limited and that certain embodiments may also be applicable to other micro devices such as diodes, transistors, dies, chips, integrated circuits, and MEMs.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. On layer in "contact" with another layer may be directly in contact with the other layer or with one or more intervening layers.

Without being limited to a particular theory, embodiments of the invention describe an electrostatic transfer head assembly supporting an array of electrostatic transfer heads which operate in accordance with principles of electrostatic grippers, using the attraction of opposite charges to pick up micro devices. In accordance with embodiments of the present invention, a pull-in voltage is applied to an electrostatic transfer head in order to generate a grip pressure on a micro device and pick up the micro device. The terms "micro" device or "micro" LED devices as used herein may refer to the descriptive size of certain devices or structures in accordance with embodiments of the invention. As used herein, the terms "micro" devices or structures are meant to refer to the scale of 1 to 100 µm. However, embodiments of the present invention are not necessarily so limited, and certain aspects of the embodiments may be applicable to larger, and possibly smaller size scales. In an embodiment, a single micro device in an array of micro devices, and a single electrostatic transfer head in an array of electrostatic transfer heads both have a maximum dimension, for example length or width, of 1 to 100 µm. In an embodiment, the top contact surface of each micro device or electrostatic transfer head has a maximum dimension of 1 to 100 µm. In an embodiment, the top contact surface of each micro device or electrostatic transfer head has a maximum dimension of 3 to 20 µm. In an embodiment, a pitch of an array of micro devices, and a pitch of a corresponding array of electrostatic transfer heads is (1 to 100 µm) by (1 to 100 µm), for example a 20 µm by 20 µm, or 5 µm by 5 µm pitch. At these densities a 6 inch carrier substrate, for example, can accommodate approximately 165 million micro LED devices with a 10 µm by 10 µm pitch, or approximately 660 million micro LED devices with a 5 µm by 5 µm pitch. A transfer tool including an electrostatic transfer head assembly and an array of electrostatic transfer heads matching an integer multiple of the pitch of the corresponding array of micro LED devices can be used to pick up, transfer, and bond the array of micro LED devices to a receiving substrate. In this manner, it is possible to integrate and assembly micro LED devices into heterogeneously integrated systems, including substrates of any size ranging from micro displays to large area displays, and at high transfer rates. For example, a 1 cm by 1 cm array of electrostatic transfer heads can pick up, transfer, and bond more than 100,000 micro devices, with larger arrays of electrostatic transfer heads being capable of transferring more micro devices.

In one aspect, embodiments of the invention describe systems and methods for transferring an array of micro devices from a carrier substrate to a receiving substrate in a matter of one tenth of a second to several seconds, and bonding the array of micro devices to the carrier substrate in one fourth (¼) the transfer time. In an embodiment, energy is transferred from an electrostatic transfer head assembly and through an array of micro devices to bond the array of micro devices to the receiving substrate. For example, a micro device may be bonded to the receiving substrate with a micro device bonding layer transferred with the micro device, a bonding layer on the receiving substrate, or the micro device bonding layer may be bonded with the receiving substrate bonding layer. The bonds between the micro devices and receiving substrate may also be electrically conductive. For example, the bond may be to an anode or cathode of a micro LED device.

In accordance with embodiments of the invention, bonding is facilitated by the application of energy to the bonding layer(s). Elevated temperatures and thermal cycling, however, can cause interdiffusion and degradation of layers within the micro devices, oxidation of the bonding layers (both micro device bonding layers and receiving substrate bonding layers), and mechanical deformation of the structures in the electrostatic transfer head assembly and receiving or carrier substrate. Mechanical deformation of the structures in the electrostatic transfer head assembly can further result in misalignment of system components, which may be aligned within a micron or less. In certain embodiments the receiving substrate may be a display substrate including thin film transistors. Such a substrate may be susceptible to bowing if subjected to excessive temperatures. Accordingly, embodiments of the invention describe systems and methods for applying energy to form viable electrical bonds, while mitigating the side effects of elevated temperatures and thermal cycling on system components. In accordance with embodiments of the invention, energy is transferred from the electrostatic transfer head assembly to bond the array of micro devices to the receiving substrate using a bonding technique such as thermal bonding or thermocompression bonding (TCB). Furthermore, the transferred energy may be utilized to bond the array of micro devices to the receiving substrate with a variety of bonding mechanisms in which one or more bonding layers may or may not be liquefied. For example, in an embodiment, transient liquid phase bonding or eutectic alloy bonding may be accompanied by liquefying of a bonding layer or interface between bonding layers. In an embodiment, solid state diffusion bonding may be performed between bonding layers without liquefying.

Referring now to FIG. 1, top and cross-sectional side view illustrations of a carrier substrate and an array of micro LED devices are shown in accordance with an embodiment of the invention. In the particular embodiments illustrated, an individual micro LED device 150 is illustrated as a pair of concentric squares with tapered or rounded corners, with each square having a different width corresponding to the different widths of the top and bottom surfaces of the micro p-n diodes, and the corresponding tapered sidewalls spanning from the top and bottom surfaces. However, embodiments of the invention do not require tapered sidewalls, and the top and bottom surfaces of the micro p-n diodes may have the same diameter, or width, and vertical sidewalls. As illustrated, the array of micro LED devices is described as having a pitch (P), spacing (S) between each micro LED device and a maximum width (W) of each micro LED devices. In order for clarity and conciseness, only x-dimensions are illustrated by the dotted lines in the top view illustration, though it is understood that similar y-dimensions may exist, and may have the same or different dimensional values. In the particular embodiments illustrated, the x- and y-dimensional values are identical. In one embodiment, the array of micro LED devices may have a pitch (P) of 1 to 100 μm, and a maximum width (W) of 1 to 100 μm. The spacing (S) may be minimized so as to maximize the number of micro LED devices that are poised for pick up on a carrier substrate. In an embodiment, the pitch (P) is 10 μm, spacing (S) is 2 μm, and width (W) is 8 μm. In another embodiment, the pitch (P) is 5 μm, spacing (S) is 2 μm, and width (W) is 3 μm. However, embodiments of the invention are not limited to these specific dimensions, and any suitable dimension may be utilized.

In the particular embodiment illustrated in FIG. 1, the micro device is a micro LED device. For example, a micro LED device 150 may include a micro p-n diode and a top conductive contact layer 130, a bottom conductive contact layer 120, with the bottom conductive contact layer 120 between the micro p-n diode and a bonding layer 110 formed on a carrier substrate 101. In an embodiment, the micro p-n diode includes a top n-doped layer 114, one or more quantum well layers 116, and a lower p-doped layer 118. In other embodiments, the doping of layers 114, 116 may be reversed. The conductive contact layers 120, 130 may include one or more layers. For example, the conductive contact layers 120, 130 may include an electrode layer that makes ohmic contact with the micro p-n diode. In an embodiment, bottom conductive contact layer 120 includes an electrode layer and a barrier layer between the electrode layer and the bonding layer 110. The barrier layer may protect against diffusion or alloying between the bonding layer and other layers in the electrode layer, for example during bonding to the receiving substrate. In an embodiment, the barrier layer may include a material such as Pd, Pt, Ni, Ta, Ti and TiW. The conductive contact layers 120, 130 may be transparent to the visible wavelength range (e.g. 380 nm-750 nm) or opaque. The conductive contact layers 120, 130 may optionally include a reflective layer such as Ag or Ni. In an embodiment, the bottom surface of the micro p-n diode is wider than the top surface of the conductive contact layer 120. In an embodiment, the bottom surface of the conductive contact layer is wider than a top surface of the bonding layer 110. A conformal dielectric barrier layer (not illustrated) may optionally be formed over the micro p-n diode and other exposed surfaces.

In accordance with embodiments of the invention, bonding layer 110 may be formed of a variety of materials useful for bonding the micro devices to a receiving substrate upon transfer of energy from the electrostatic transfer head assembly. Thickness of the bonding layer 110 may depend upon the bonding techniques, bonding mechanisms, and materials selections. In an embodiment, bonding layer is between 100 angstroms as 2 μm thick. In one embodiment the bonding layer 110 may be formed of a low temperature solder material for bonding the micro devices to the receiving substrate at low temperatures. Exemplary low temperature solder materials may be indium, bismuth, or tin based solder, including pure metals and metal alloys. An exemplary list of low melting solder materials which may be utilized with embodiments of the invention are provided in Table 1, in which the chemical compositions are listed by weight percent of the components.

TABLE 1

| Chemical composition (weight %) | Liquidus Temperature (° C.) | Solidus Temperature (° C.) |
|---|---|---|
| 100 In | 156.7 | 156.7 |
| 66.3In33.7Bi | 72 | 72 |
| 51In32.5Bi16.5Sn | 60 | 60 |
| 57Bi26In17Sn | 79 | 79 |
| 54.02Bi29.68In16.3Sn | 81 | 81 |
| 67Bi33In | 109 | 109 |
| 90In10Sn | 151 | 143 |
| 48In52Sn | 118 | 118 |
| 50In50Sn | 125 | 118 |
| 52Sn48In | 131 | 118 |
| 58Sn42In | 145 | 118 |
| 97In3Ag | 143 | 143 |
| 94.5In5.5Ag | 200 | — |
| 99.5In0.5Au | 200 | — |
| 95In5Bi | 150 | 125 |
| 99.3In0.7Ga | 150 | 150 |
| 99.4In0.6Ga | 152 | 152 |
| 99.6In0.4Ga | 153 | 153 |
| 99.5In0.5Ga | 154 | 154 |
| 58Bi42Sn | 138 | 138 |
| 60Sn40Bi | 170 | 138 |
| 100Sn | 232 | 232 |
| 95Sn5Sb | 240 | 235 |
| 100Ga | 30 | 30 |
| 99In1Cu | 200 | — |
| 98In2Cu | 182 | — |
| 96In4Cu | 253 | — |
| 74In26Cd | 123 | 123 |
| 70In30Pb | 175 | 165 |
| 60In40Pb | 181 | 173 |
| 50In50Pb | 210 | 184 |
| 40In60Pb | 231 | 197 |
| 55.5Bi44.5Pb | 124 | 124 |
| 58Bi42Pb | 126 | 124 |
| 45.5Bi54.5Pb | 160 | 122 |
| 60Bi40Cd | 144 | 144 |
| 67.8Sn32.2Cd | 177 | 177 |
| 45Sn55Pb | 227 | 183 |
| 63Sn37Pb | 183 | 183 |
| 62Sn38Pb | 183 | 183 |
| 65Sn35Pb | 184 | 183 |
| 70Sn30Pb | 186 | 183 |
| 60Sn40Pb | 191 | 183 |
| 75Sn25Pb | 192 | 183 |
| 80Sn20Pb | 199 | 183 |
| 85Sn15Pb | 205 | 183 |
| 90Sn10Pb | 213 | 183 |
| 91Sn9Zn | 199 | 199 |
| 90Sn10Au | 217 | 217 |
| 99Sn1Cu | 227 | 227 |
| 99.3Sn0.7Cu | 227 | 227 |

In another embodiment, the bonding layer 110 is formed of an electrically conductive adhesive material. For example, the adhesive can be a thermoplastic or thermosetting polymer including conductive particles (e.g. metal particles).

In another embodiment, the bonding layer 110 is formed of a material characterized by a liquidus or melting temperature which is above the bonding temperature used to bond the micro device 150 to the receiving substrate or above an ambient liquidus temperature of a receiving substrate bonding layer. As described in further detail below, such a bonding layer may be used for bonding mechanisms including eutectic alloy bonding, transient liquid phase bonding, or solid state diffusion bonding with another bonding layer on the receiving substrate. The bonding layer 110 material may also be selected for its ability to diffuse with a receiving substrate bonding layer material. In an embodiment, the bonding layer may have a liquidus temperature above 250° C. such as bismuth (271.4° C.), or a liquidus temperature above 350° C. such as gold (1064° C.), copper (1084° C.), silver (962° C.), aluminum (660° C.), zinc (419.5° C.), or nickel (1453° C.). The bonding layer is not limited to these exemplary materials, and may include other semiconductor, metal, or metal alloy materials characterized by a liquidus or melting temperature which is above the bonding temperature used to bond the micro device to the receiving substrate.

Figure 2:
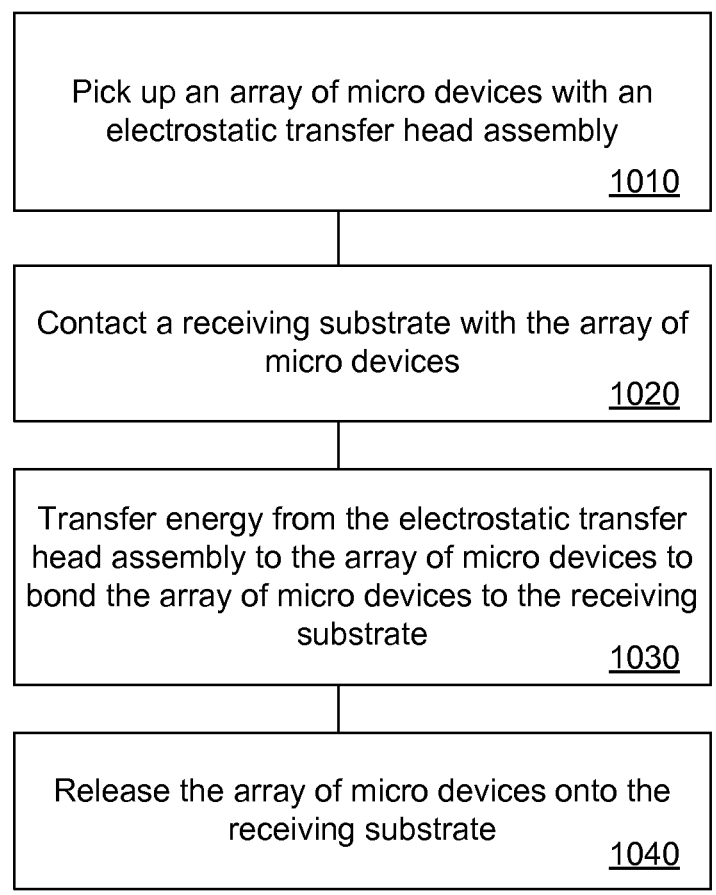
FIG. 2 is a flow chart of a method of transferring and bonding an array of micro devices to a receiving substrate in accordance with an embodiment of the invention
Figure 3A:
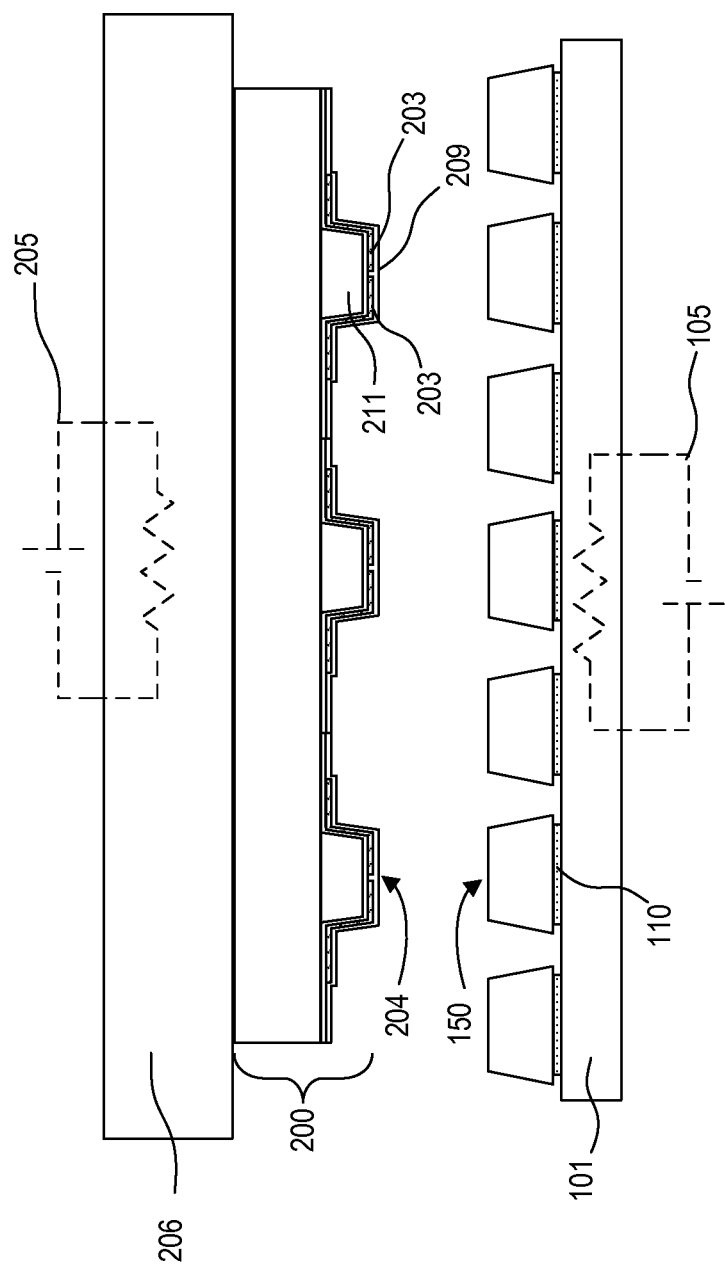
FIGS. 3A-3G are cross-sectional side view illustrations of a method of transferring and bonding an array of micro devices to a receiving substrate in accordance with an embodiment of the invention
Figure 3B:
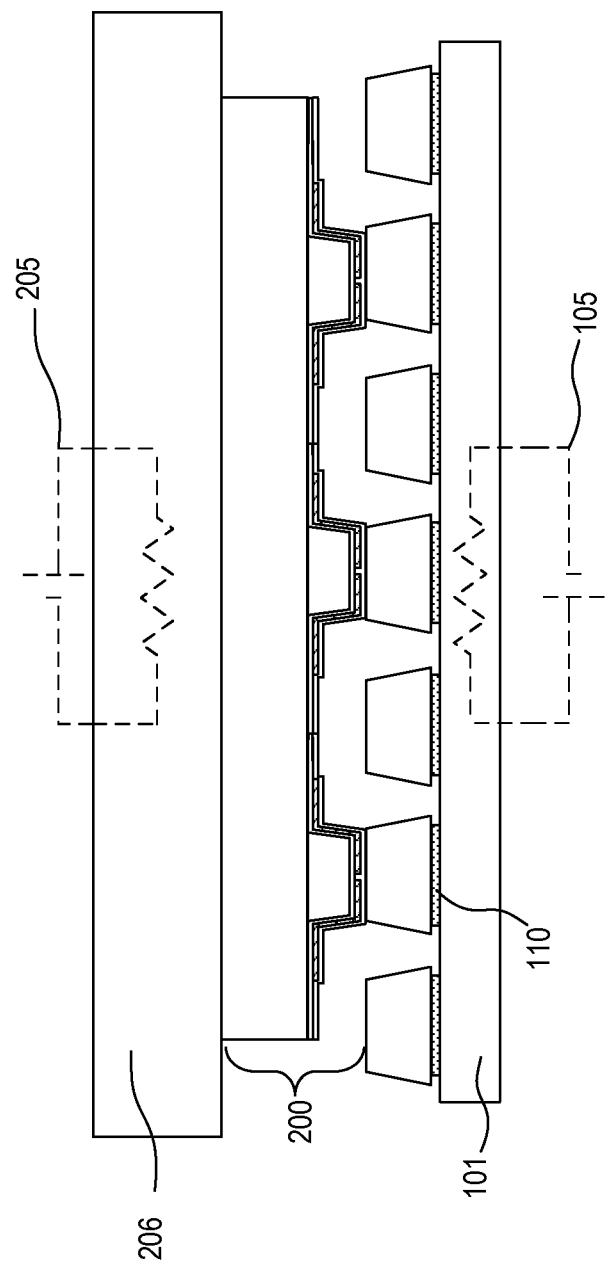

FIG. 2 is a flow chart and FIGS. 3A-3G are cross-sectional side view illustrations of a method of transferring and bonding an array of micro devices to a receiving substrate in accordance with an embodiment of the invention. At operation 1010 an array of micro devices is picked up from a carrier substrate with an electrostatic transfer head assembly. FIG. 3A is a cross-sectional side view illustration of an array of electrostatic transfer heads 204 supported by a substrate 200 and positioned over an array of micro LED devices 150 in accordance with an embodiment of the invention. As illustrated, the pitch (P) of the array of electrostatic transfer heads 204 matches an integer multiple of the pitch of the micro LED devices 150. The array of micro LED devices 150 are then contacted with the array of electrostatic transfer heads 204 as illustrated in FIG. 3B. The array of electrostatic transfer head may also be positioned over the array of micro devices with a suitable air gap separating them which does not significantly affect the grip pressure, for example, a 1 nm or 10 nm gap.

Figure 3C:
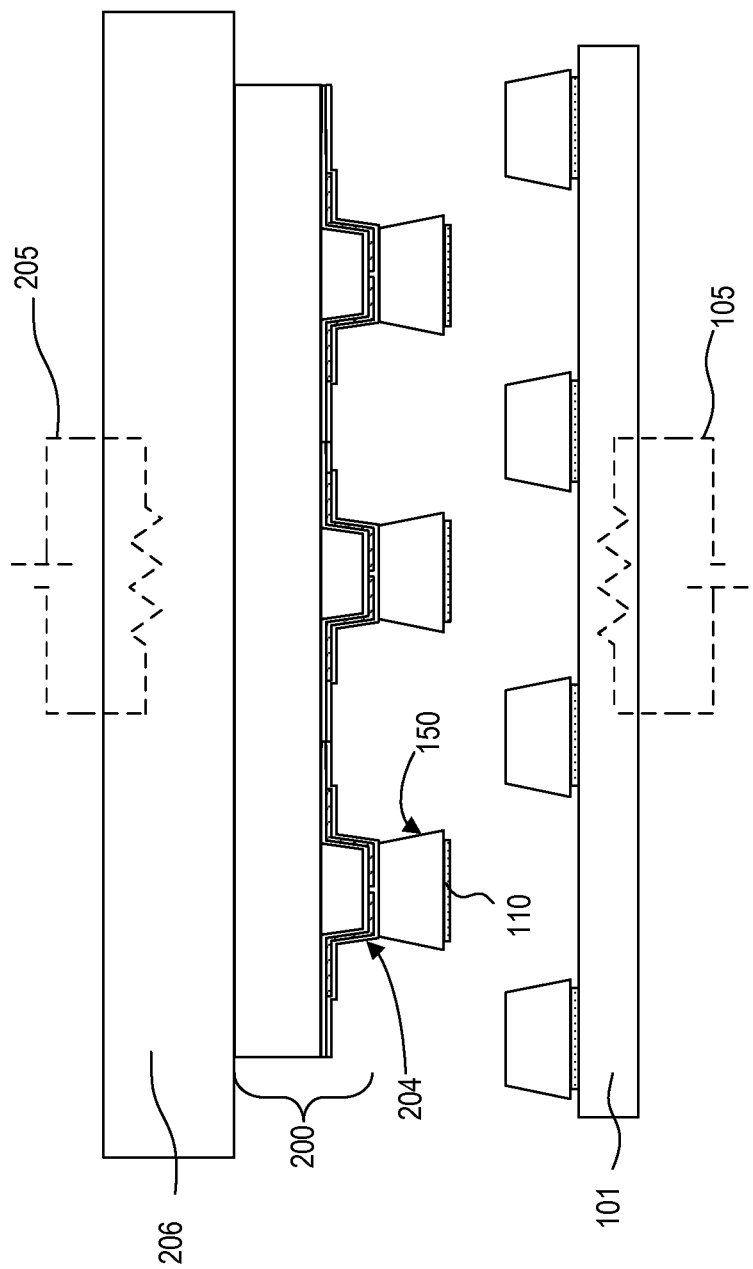

In order to pick up the array of micro devices a voltage may applied to the array of electrostatic transfer heads 204. In an embodiment, the voltage may be applied from the working circuitry within or connected to an electrostatic transfer head assembly 206 in electrical connection with the array of electrostatic transfer heads 204. Referring again to FIG. 3A, in the exemplary embodiments illustrated, the electrostatic transfer heads 204 are bipolar electrostatic transfer heads including a pair of electrodes 203 covered by a dielectric layer 209. However, embodiments are not limited to a bipolar electrode configuration and other configurations such as monopolar electrodes may be used. As illustrated, each electrostatic transfer head 204 includes a mesa structure 211 protruding from the substrate 200. In this manner each electrostatic transfer head 204 is configured to pick up an individual micro device. The array of micro devices 150 is then picked up with the electrostatic transfer head assembly 206 as illustrated in FIG. 3C. As illustrated, the micro device bonding layers 110 are also picked up with the array of micro devices 150.

In the embodiments illustrated in FIGS. 3A-3G, energy may be transferred to the bonding layers through the optional heaters 105, 205, 305, illustrated with dotted lines. In the embodiments illustrated in FIGS. 3A-3C, heat may be transferred through the electrostatic transfer head assembly 206, through the array of electrostatic transfer heads 204 and the array of micro devices 150, and to bonding layers 110 with one or more heaters 205. Heat may be also or alternatively be transferred through a carrier substrate 101 and to the bonding layers 110 with one or more heaters 105. Heat can be applied in a variety of fashions including infra red heat lamps, lasers, and resistive heating elements, amongst others.

The pick up operations illustrated in FIS. 3A-3C may be performed at a variety of temperatures. In some embodiments the substrate 200 supporting the array of electrostatic transfer heads 204 is maintained at room temperature during the pick up operations in FIGS. 3A-3C. In some embodiments the substrate 200 supporting the array of transfer heads 204 is maintained slightly above (e.g. 5 to 25° C. above) room temperature during the pick up operations in FIGS. 3A-3C to compensate for variations in room temperature. In some embodiments the substrate 200 supporting the array of electrostatic transfer heads 204 is maintained at the same temperature during the pick up operations in FIGS. 3A-3C as the substrate 200 supporting the array of electrostatic transfer heads 204 is maintained during bonding to the array of micro devices to the receiving substrate, for example, above an ambient liquidus temperature of a receiving substrate bonding layer. Where the bonding layer 110 has a liquidus temperature below the bonding temperature or the ambient liquidus temperature of the receiving substrate bonding layer, the bonding layer 110 may remain in the solid phase during the pick up operations in FIGS. 3A-3C. In this manner, by not liquefying the bonding layer the pick up and transfer process may be simplified by not having to handle a material in liquid phase, and to control the phase of the material during transfer and formation of the micro devices. Furthermore, by maintaining the substrate 200 supporting the array of electrostatic transfer heads 204 at a uniform temperature, even at the elevated bonding temperature, the uniform temperature profile may protect the structural integrity of the electrostatic transfer head assembly can alignment of system components. In other embodiments the substrate 200 supporting the array of electrostatic transfer heads 204 is subjected to a thermal cycle, for example ramped up above a liquidus temperature of the bonding layer 110 to pick up the array of micro devices from the carrier substrate.

Figure 3D:
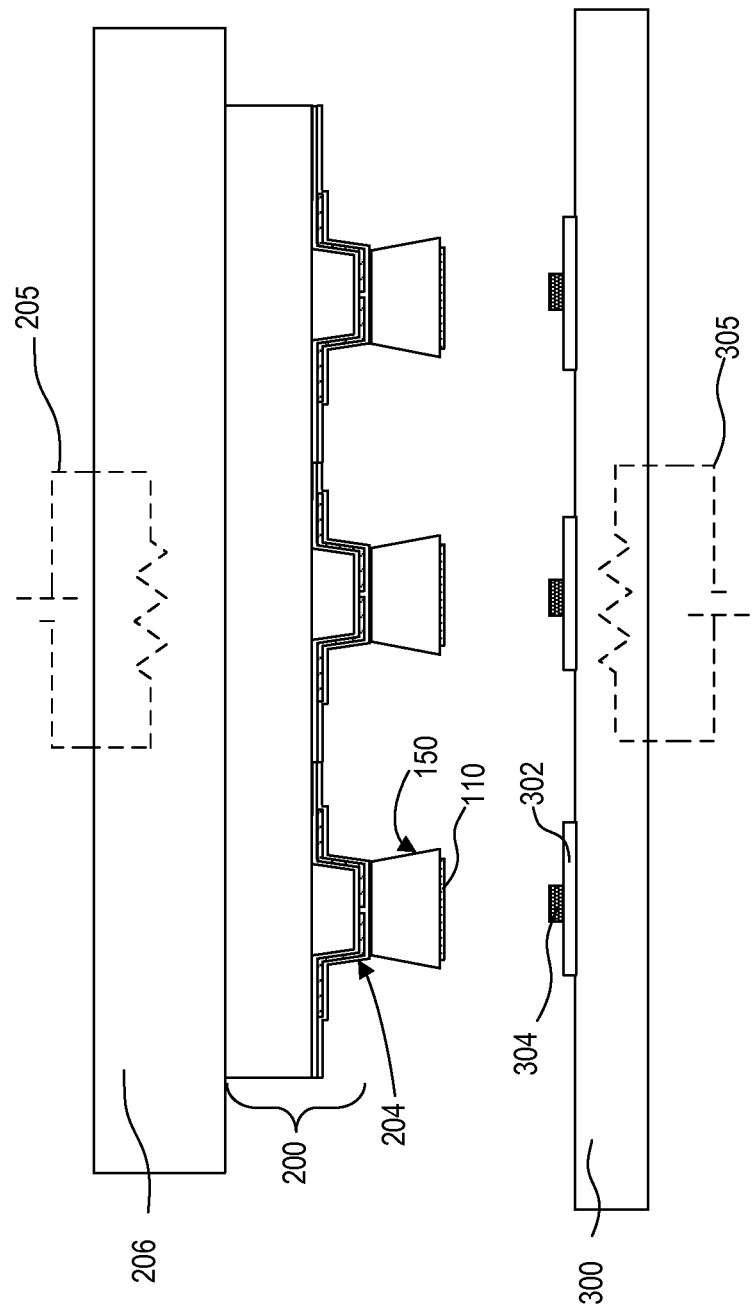

At operation 1020 a receiving substrate is contacted with the array of micro devices. FIG. 3D is a cross-sectional side view illustration of an array of electrostatic transfer heads 204 holding an array of micro devices 150 over a receiving substrate 300. As illustrated, the array of micro devices 150 may be positioned over contact pads 302 and bonding layers 304 on the receiving substrate. In accordance with embodiments of the invention, heat may be transferred through the receiving substrate 300 and into the bonding layers with one or more heaters 305. Heat can be applied in a variety of fashions including infra red heat lamps, lasers, and resistive heating elements, amongst others. In an embodiment, receiving substrate 300 is heated to a temperature below (e.g. 1 to 50° C. below) the liquidus or melting temperature of the bonding layer 304. In an embodiment, the receiving substrate 300 is heated to a temperature below (e.g. 1 to 50° C. below) the bonding temperature. While the particular embodiment illustrated includes both a bonding layer 304 and contact pad 302, embodiments of the invention are not so limited. For example, a single bonding layer 304 or single contact pad 302 may be present. In another embodiment, multiple bonding layers may be used. For example, a bonding layer matching the composition of bonding layer 110 may be located between bonding layer 304 and contact pad 302. In an embodiment, a bonding layer matching the composition of bonding layer 110 is formed over bonding layer 304 to protect against oxidation of bonding layer 304. Alternatively, a single bonding layer or contact pad may be used for bonding multiple micro devices, rather than individual micro devices.

Still referring to FIG. 3D, the receiving substrate 300 may be, but is not limited to, a display substrate, a lighting substrate, a substrate with functional devices such as transistors or ICs, or a substrate with metal redistribution lines. In an embodiment, the substrate is a display substrate including thin film transistors. Depending upon the particular application, substrate 300 may be opaque, transparent, or semi-transparent to the visible wavelength (e.g. 380-750 nm wavelength), and substrate 300 may be rigid or flexible. For example, substrate 300 may be formed of glass or a polymer such as polyethylene terephthalate (PET), polyethelyne naphthalate (PEN), polycarbonate (PC), polyethersulphone (PES), aromatic fluorine-containing polyarylates (PAR), polycyclic olefin (PCO), and polyimide (PI). Depending upon the particular application contact pad 302 may be opaque, transparent, or semi-transparent to the visible wavelength. Exemplary transparent conductive materials include amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment contact pad 302 is approximately 100 nm-200 nm thick ITO. In an embodiment, the contact pad 302 includes nanoparticles such as silver, gold, aluminum, molybdenum, titanium, tungsten, ITO, and IZO. The contact pad 302 or may also be reflective to the visible wavelength. In an embodiment, a contact pad 302 comprises a reflective metallic film such as aluminum, molybdenum, titanium, titanium-tungsten, silver, or gold, or alloys thereof. In an embodiment, contact pad 302 functions as an electrode (e.g. anode or cathode) or electrode line.

A receiving substrate bonding layer 304 may optionally be formed over the conductive pad 302 to facilitate bonding of the micro device. Bonding layer 304 may be formed of any of the materials described above with regard to bonding layer 110. The particular selection of materials for bonding layers 110, 304 may dependent upon the particular bonding mechanism such as eutectic alloy bonding, transient liquid phase bonding, or solid state diffusion bonding described in further detail below.

Figure 3E:
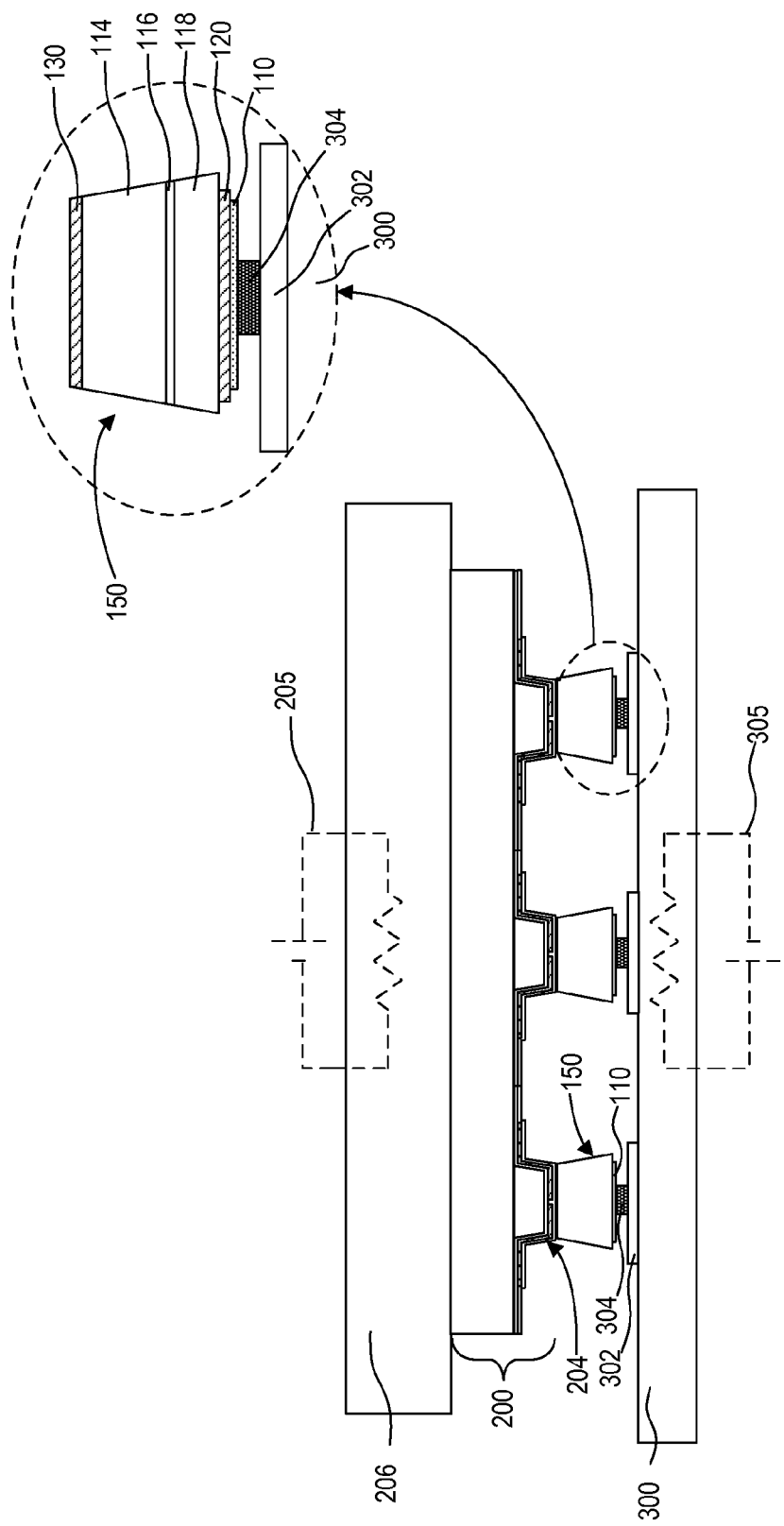
Figure 3F:
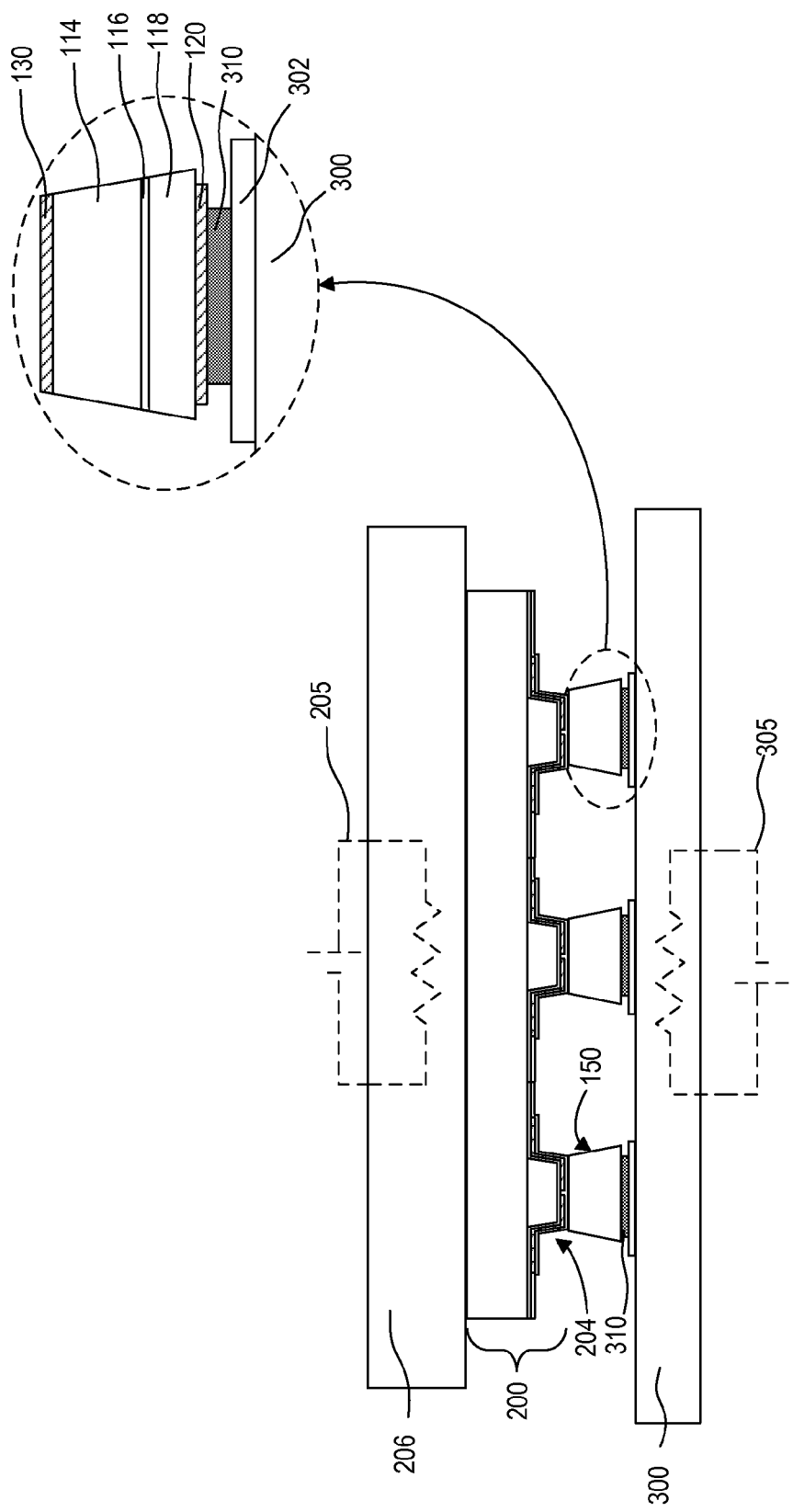

Referring now to FIG. 3E, the receiving substrate 300 is contacted with the array of micro devices 150. As shown in the close-up illustration of a single micro device 150, in an embodiment contacting the receiving substrate with the array of micro devices includes contacting a receiving substrate bonding layer 304 with a micro device bonding layer 110 for each respective micro device. In an embodiment, each micro device bonding layer 110 is wider than a corresponding receiving substrate bonding layer 304. For example, as illustrated, the receiving substrate bonding layers 304 may be in the form of posts onto which the micro devices 150 will be placed. In an embodiment, the receiving substrate bonding layer 304 is approximately 1 μm wide, and is approximately 0.1 μm to 2 μm thick. A post structure may be useful in a variety of bonding operations. In one implementation, by decreasing the width of bonding layer 304 relative to the bonding layer 110, the pressure realized at the interface may be higher than the pressure applied to the micro devices 150 from the electrostatic transfer heads 204. In another implementation, where bonding layer 304 is liquefied during the bonding operation, the liquefied bonding layer 304 may act as a cushion and partially compensate for system uneven leveling (e.g nonplanar surfaces) between the array of micro devices 150 and the receiving substrate 300 during bonding, and for variations in height of the micro devices.

At operation 1030 energy is transferred from the electrostatic transfer head assembly and through the array of micro devices to bond the array of micro devices to the receiving substrate. Transferring energy from the electrostatic transfer head assembly and through the array of micro devices may facilitate several types of bonding mechanisms such as eutectic alloy bonding, transient liquid phase bonding, and solid state diffusion bonding. In an embodiment thermal energy transferred from the electrostatic transfer head assembly is also accompanied by the application of pressure from the electrostatic transfer head assembly.

Figure 3G:
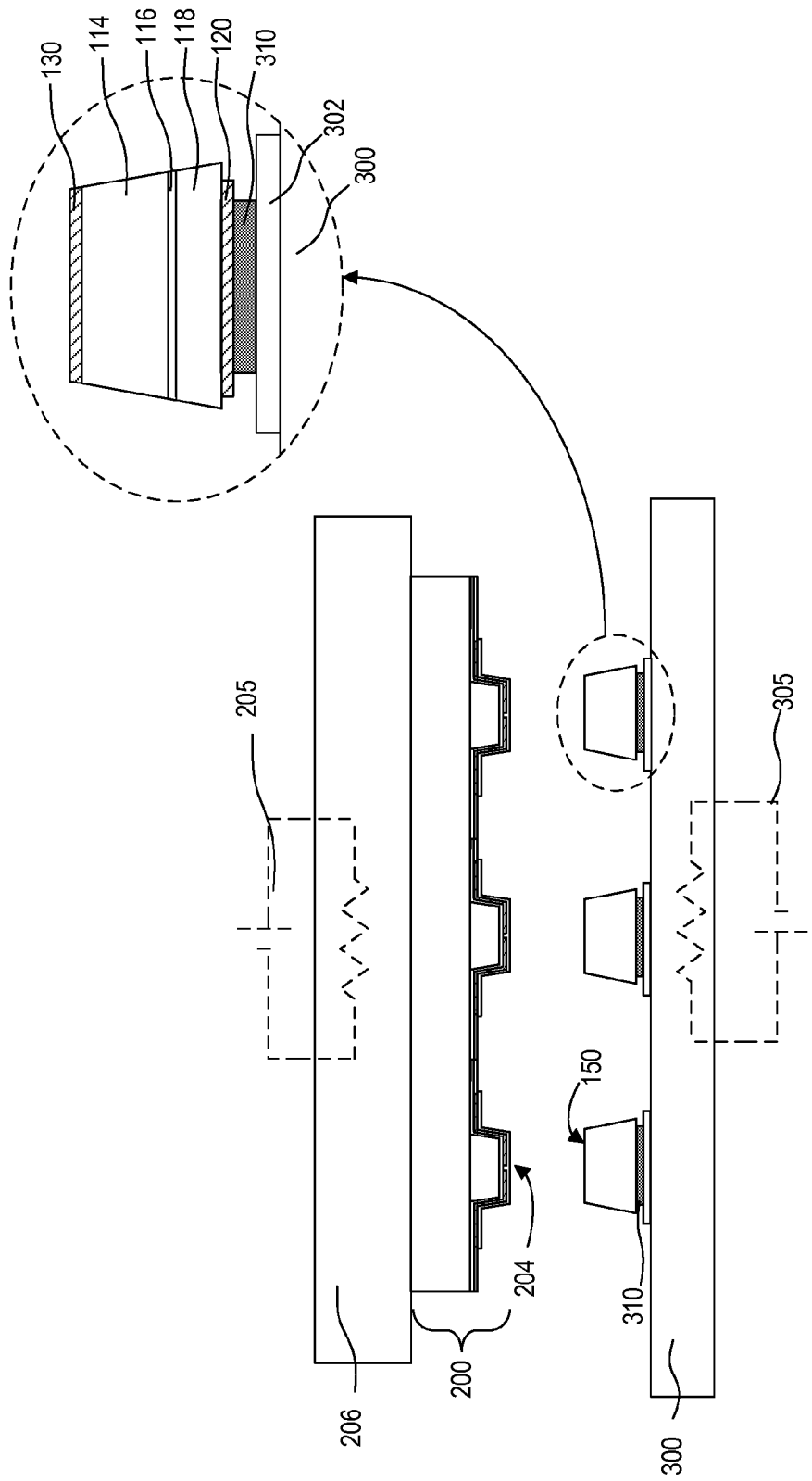
Figure 3H:
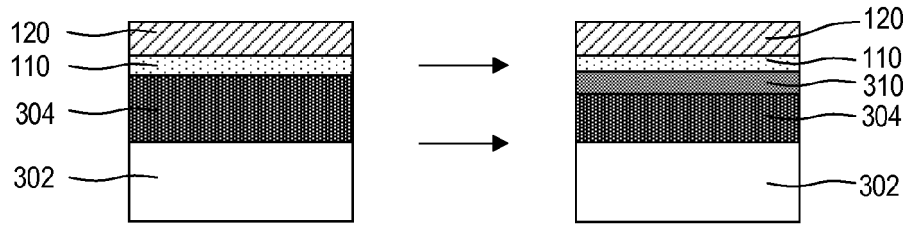
FIGS. 3H-3J are cross-sectional side view illustrations a micro device bonded to a receiving substrate in accordance with embodiments of the invention.
Figure 3I:
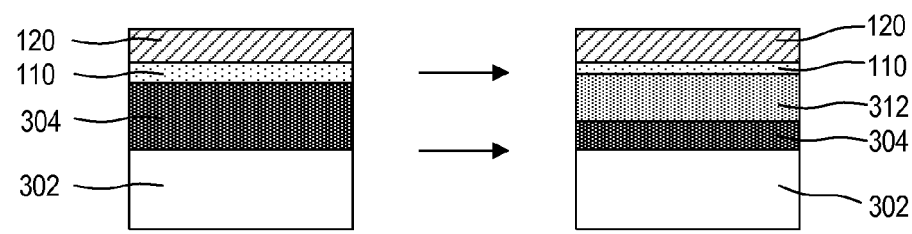
Figure 3J:
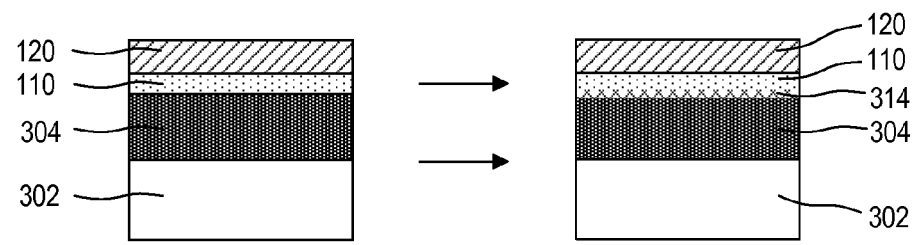

FIGS. 3H-3J are cross-sectional side view illustrations of exemplary types of bonding mechanisms that may occur between a micro device and receiving substrate. It is to be appreciated that the material structures illustrated and described with regard to FIGS. 3H-3J are exemplary in nature and are intended to convey different bonding mechanisms, and that embodiments of the invention are not limited to the simplified examples illustrated and described. Furthermore, as described above embodiments of the invention include alternative layer configurations, and embodiments are not limited to the specific layers illustrated in FIGS. 3H-3J. Referring now to FIG. 3H, in the particular embodiment illustrated a eutectic alloy bonding layer 310 is formed from the micro device bonding layer 110 and receiving substrate bonding layer 304 for each respective micro device. In such an embodiment, the energy transferred from the electrostatic transfer head assembly may liquefy a eutectic alloy bonding layer 310 formed at the interface of bonding layers 110, 304 after the formation of an alloy due to diffusion of one or both of the bonding layers. In an embodiment, the bonding layers 110, 304 may be completely consumed during the formation of the eutectic alloy bonding layer 310 if their volumes are precisely controlled to reflect the eutectic composition. In other embodiments, one or both of the bonding layers 110, 304 are not completely consumed. In an embodiment, eutectic alloy bonding is performed by heating bonding layers 110, 304 to a temperature exceeding the eutectic point by 5-30° C., followed by cooling down to a temperature below the eutectic temperature. An exemplary non-limiting list of eutectic bonding alloys and eutectic temperatures is provided below in Table 2. In an embodiment, the electrostatic transfer head assembly applies a low contact pressure (e.g. 0.1 MPa to 1 MPa) during eutectic alloy bonding in order to prevent the liquid phase from excessively squeezing out from between the micro device and receiving substrate.

TABLE 2

| Eutectic alloy (wt %) | Eutectic temperature (° C.) | Bonding layer 110 material | Bonding layer 304 material |
| --- | --- | --- | --- |
| Au:Sn (20/80) | 280 | Au | Sn |
| Au:Ge (28/72) | 361 | Au | Ge |
| Al:Ge (49/51) | 419 | Al | Ge |
| Ag:In (3/97) | 143 | Ag | In |

As described above, the substrate 200 supporting the array of electrostatic transfer heads 204 and the receiving substrate 300 may be heated. In an embodiment, the substrate 200 is heated to a temperature below the liquidus temperature of bonding layer 110, and the receiving substrate 300 is heated to a temperature below the liquidus temperature of bonding layer 304. In certain embodiments, the transfer of heat from the electrostatic transfer head assembly 206 though the array of micro devices is sufficient form the eutectic alloy. For example, the electrostatic transfer head assembly may be held at a temperature of 5-30° C. above the eutectic temperature, while bonding layer 110 is formed of a eutectic alloy component with a liquidus temperature above the eutectic temperature. In a specific embodiment, the substrate 200 supporting the array of electrostatic transfer heads 204 is held at 150° C., bonding layer 110 is formed of Ag, and bonding layer 304 is formed of In. The temperatures of the substrates 200, 300 may be maintained throughout the process, or ramped up during bonding. Upon completion of eutectic alloy bonding, the temperature of one of the substrate 200 or 300 may be reduced to solidify the eutectic alloy.

Referring to FIG. 3I, in the particular embodiment illustrated transient liquid phase bonding includes liquefying the receiving substrate bonding layer 304 to interdiffuse the receiving substrate bonding layer 304 with the micro device bonding layer 110 and form an inter-metallic compound layer 312 having an ambient melting temperature higher than an ambient melting temperature of the receiving substrate bonding layer 304. In an embodiment, the bonding layers 110, 304 may be completely consumed during the formation of the inter-metallic compound layer 312. In other embodiments the one or both of bonding layers 110, 304 are not completely consumed. Transient liquid phase bonding may be accomplished at or above the lowest liquidus temperature of the bonding layers. In an embodiment, the micro device bonding layer 110 includes the higher melting temperature material and the receiving substrate bonding layer 304 includes the lower melting temperature material. In an embodiment, the micro device bonding layer 110 may have a liquidus temperature above 250° C. such as bismuth (271.4° C.), or a liquidus temperature above 350° C. such as gold (1064° C.), copper (1084° C.), silver (962° C.), aluminum (660° C.), zinc (419.5° C.), or nickel (1453° C.). In an embodiment, the receiving substrate bonding layer 304 has a liquidus temperature below the liquidus temperature of bonding layer 110. For example, the receiving substrate bonding layer 304 may be any of the low temperature solders listed in Table 1 above. In an embodiment, the receiving substrate bonding layer 304 includes tin (232° C.) or indium (156.7° C.). A list of exemplary materials system for transient liquid phase bonding is provided below in Table 3 along with melting temperatures of some exemplary inter-metallic compounds that may be formed.

TABLE 3

| Bonding layer 110 material | Bonding layer 304 material | Inter-metallic compound melting temperature (° C.) |
|---|---|---|
| Cu | Sn | 415 |
| Ag | Sn | 600 |
| Ag | In | 880 |
| Au | Sn | 278 |
| Au | In | 495 |
| Ni | Sn | 400 |

As described above, the substrate 200 supporting the array of electrostatic transfer heads 204 and the receiving substrate 300 may be heated. In an embodiment, the substrate 200 is heated to a temperature below the liquidus temperature of bonding layer 110, and the receiving substrate 300 is heated to a temperature below the liquidus temperature of bonding layer 304. In certain embodiments, the transfer of heat from the electrostatic transfer head assembly though the array of micro devices is sufficient to form the transient liquid state of bonding layer 304 with subsequent isothermal solidification as an inter-metallic compound. While in the liquid phase, the lower melting temperature material both spreads out over the surface and diffuses into a solid solution of the higher melting temperature material or dissolves the higher melting temperature material and solidifies as an inter-metallic compound. For example, the substrate 200 supporting the array of electrostatic transfer heads 204 may be held at a temperature of 10-70° C., or more particularly 10-30° C., above the liquidus temperature of the receiving substrate bonding layer 304, while bonding layer 110 is formed of a component with a liquidus temperature above the liquidus temperature of bonding layer 304. In a specific embodiment, the substrate 200 supporting the array of electrostatic transfer heads 204 is held at 180° C., bonding layer 110 is formed of Au, and bonding layer 304 is formed of In. In an embodiment, the electrostatic transfer head assembly applies a low contact pressure during initial contact at operation 1020 for transient liquid phase bonding in order to prevent the liquid phase from excessively squeezing out from between the micro device and receiving substrate. In accordance with embodiments of the invention, pressure may be related to the strength of bonding layers. For example, indium has a tensile strength of 1.6 MPa at room temperature. In an embodiment, the applied pressure is below the tensile strength of a metal bonding layer material at room temperature. For example, where bonding layer 304 is indium, the applied pressure may be below 1 MPa.

In accordance with some embodiments of the invention, eutectic alloy bonding and transient liquid phase bonding can both provide an additional degree of freedom for system component leveling, such as planarity of the array of micro devices with the receiving substrate, and for variations in height of the micro devices due to the change in height of the liquefied bonding layers as they spread out over the surface.

Referring to FIG. 3J, in the particular embodiment illustrated solid state diffusion bonding occurs between the receiving substrate bonding layer 304 and micro device bonding layer 110 to form a metal bond 314. In such an embodiment, solid state diffusion occurs at a temperature below the ambient melting temperature of the bonding layers 304, 110. Where the bonding mechanism includes solid state diffusion, application of heat at pressure may aid in diffusion. For example, thermocompression bonding (TCB) may be used. During solid state diffusion a metal bond is established between two metal surface pressed together. By heating the two surfaces, the amount of pressure applied for the bonding process can be reduced due to metal softening. Non-limiting examples of materials for layers 110, 304 may include Au—Au, Cu—Cu, Al—Al, though dissimilar metals may also be used. As described above, the substrate 200 supporting the array of electrostatic transfer heads 204 and the receiving substrate 300 may be heated. In an embodiment, the substrate 200 and receiving substrate 300 are both heated to temperatures below the liquidus temperatures of the bonding layers 110, 304. In an embodiment, TCB is performed at a temperature range of 200° C. -500° C. Furthermore, pressure may be higher than pressures used for eutectic alloy bonding and transient liquid phase bonding. For example, pressures for TCB may be from above 1 MPa to 20 MPa.

Following the transfer of energy to bond the array of micro devices to the receiving substrate, the array of micro devices are released onto the receiving substrate at operation 1040 and illustrated in FIG. 3G. Where the transfer heads 204 include bipolar electrodes, an alternating voltage may be applied across the pair of electrodes in each transfer head 204 so that at a particular point in time when a negative voltage is applied to one electrode, a positive voltage is applied to the other electrode in the pair, and vice versa to create the pickup pressure. Releasing the array of micro device from the transfer heads 204 may be accomplished with a variety of methods including turning off the voltage sources, lowering the voltage across the electrostatic transfer head electrodes, changing a waveform of an AC voltage, and grounding the voltage sources. Other electrode configurations may be used in accordance with embodiments of the invention. For example, monopolar electrode configurations may be used. In some embodiments the receiving substrate is further annealed after releasing the array of micro devices onto the receiving substrate to strengthen the bonds.

A variety of operations can be performed for transferring energy when contacting micro devices on a carrier substrate, picking up the micro devices, transferring the micro devices, contacting the receiving substrate with the micro devices, bonding the micro devices to the receiving substrate, and releasing the micro devices. For example, as described above, heaters 105, 205, 305 may be used to transfer energy to the bonding layers when contacting micro devices on a carrier substrate, picking up the micro devices, transferring the micro devices, contacting the receiving substrate with the micro devices, bonding the micro devices to the receiving substrate, and releasing the micro devices. In some embodiments the substrate 200 supporting the array of electrostatic transfer heads 204 can be maintained at a uniform elevated temperature during the operations illustrated and described with regard to FIGS. 3A-3G. For example, in the specific embodiments describing an Au:In bonding layer system, the substrate 200 supporting the array of electrostatic transfer heads 204 is maintained at 180° C. during the operations illustrated and described with regard to FIGS. 3A-3G. In other embodiments the substrate 200 supporting the array of electrostatic transfer heads 204 is subjected to a thermal cycle, for example ramped up above a liquidus temperature of the bonding layer 110 to pick up the array of micro devices from the carrier substrate, ramped up above a eutectic alloy bonding temperature, ramped up above a liquidus temperature of the bonding layer 304, or ramped up for TCB. In other embodiments, the temperature of the substrate 200 supporting the array of electrostatic transfer heads 204 may be lowered after initial melting to complete bonding. For example, the temperature of the substrate 200 supporting the array of electrostatic transfer heads 204 may be lowered below a eutectic alloy temperature, or liquidus temperature of a receiving substrate bonding layer. Furthermore, the electrostatic transfer head assembly can be used to transfer a specific contact pressure to the bonding layers when contacting the micro devices on the carrier substrate or receiving substrate, and during bonding the micro devices to the receiving substrate.

In utilizing the various aspects of this invention, it would become apparent to one skilled in the art that combinations or variations of the above embodiments are possible when transferring and bonding an array of micro devices to a receiving substrate. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A method comprising:
    picking up an array of micro devices from a carrier substrate with an electrostatic transfer head assembly supporting an array of electrostatic transfer heads;
    contacting a micro device bonding layer with a receiving substrate bonding layer on a receiving substrate for each respective micro device, wherein each receiving substrate bonding layer has a lower ambient liquidus temperature than a respective micro device bonding layer, and each receiving substrate bonding layer is characterized by a width extending in a direction parallel to a corresponding micro device bonding layer contact surface that contacts the receiving substrate bonding layer in which each micro device bonding layer contact surface is wider than each receiving substrate bonding layer;
    transferring thermal energy from the electrostatic transfer head assembly, liquefying the receiving substrate bonding layers, and bonding the array of micro devices to the receiving substrate;
    releasing the array of micro devices onto the receiving substrate;
    wherein each micro device has a maximum width of 1-100 µm parallel to a contact surface of the array of electrostatic transfer heads for picking up the array of micro devices;
    wherein the array of electrostatic transfer heads includes an array of mesa structures protruding from a base substrate supporting the array of electrostatic transfer heads, with each mesa structure corresponding to a separate electrostatic transfer head, and each electrostatic transfer head has a contact surface for picking up a single micro device and each electrostatic transfer head contact surface has a maximum width of 1-100 µm;
    wherein a substrate supporting the array of electrostatic transfer heads is maintained above room temperature during the sequence of:
    picking up the array of micro devices from the carrier substrate with the electrostatic transfer head assembly supporting the array of electrostatic transfer heads;
    contacting the micro device bonding layer with the receiving substrate bonding layer on the receiving substrate for each respective micro device;
    transferring thermal energy from the electrostatic transfer head assembly to liquefy the receiving substrate bonding layers, and bonding the array of micro devices to the receiving substrate; and
    releasing the array of micro devices onto the receiving substrate; and
    wherein the substrate supporting the array of electrostatic transfer heads is maintained above the ambient liquidus temperature of the receiving substrate bonding layers and below the ambient liquidus temperature of the micro device bonding layers.

2. The method of claim 1, wherein each electrostatic transfer head contact surface has a maximum width of 3-20 µm.

* * * * *